United States Patent
Katou

[11] Patent Number: 5,344,491
[45] Date of Patent: Sep. 6, 1994

[54] APPARATUS FOR METAL PLATING

[75] Inventor: Mariko Katou, Tokyo, Japan

[73] Assignee: NEC Corporation, Japan

[21] Appl. No.: 235

[22] Filed: Jan. 4, 1993

[30] Foreign Application Priority Data

Jan. 9, 1992 [JP] Japan .................. 4-001995

[51] Int. Cl.$^5$ .................. B05C 11/00; C25D 17/04
[52] U.S. Cl. .................. 118/695; 118/712; 204/297 R; 204/269; 204/238; 204/239
[58] Field of Search ............ 118/667, 712, 691, 695; 204/269, 238, 239, 297 R, 237; 427/443.1

[56] References Cited

U.S. PATENT DOCUMENTS

| | | | |
|---|---|---|---|
| 3,007,861 | 11/1961 | Winters | 204/297 R |
| 3,649,509 | 3/1972 | Morawetz et al. | 204/238 |
| 4,696,729 | 8/1987 | Santini | 204/297 R |
| 4,707,378 | 11/1987 | McBride | 427/443.1 |
| 4,757,781 | 7/1988 | Fukuda et al. | 118/410 |
| 4,808,431 | 2/1989 | Rickert | 427/443.1 |
| 4,814,197 | 3/1989 | Duffy | 427/443.1 |
| 4,935,109 | 6/1990 | Dugan | 204/239 |

Primary Examiner—W. Gary Jones
Assistant Examiner—Brenda Adele Lamb
Attorney, Agent, or Firm—Laff, Whitesel, Conte & Saret

[57] ABSTRACT

Plating cups 2 each hold therein respective semiconductor substrates to be plated. The temperatures of the plating solution in the plating cups are controlled at optimum levels by controlling the operations of heaters 13 and 16, based on the temperature of the plating cups as measured by thermometers 5 mounted on the plating cups 2. Metal ion concentration in the solution and the pH level and specific gravity of the solution are measured by an atomic absorption spectrometer 17, a pH gauge 18, and a gravimeter 19, respectively, for determining necessary amount of replenishing metal ions and solution from a solution level regulator 21, thereby maintaining the relevant parameters of the solution within a permissible range.

9 Claims, 3 Drawing Sheets

APPARATUS FOR METAL PLATING

FIELD OF THE INVENTION

The invention relates to apparatuses for plating. Particularly, it relates to apparatuses suitable for plating desired portions of a semiconductor substrate with thin layers of metals having predetermined thicknesses.

BACKGROUND OF THE INVENTION

In such plating apparatuses as mentioned above, it is necessary to monitor the plating solution to optimize such parameters as concentration of metal ions, pH level, and specific gravity and to suppress foreign particle density. Thus, conventionally a sample of plating solution is tested to check the metal ion concentration, pH level, specific gravity, and the particle density. Some of the components must be replenished while excessive foreign particles must be removed so that the metal ion concentration, pit level, specific gravity, and foreign particle numbers remain within permissible ranges.

However, such monitoring and pertinent operations for controlling the of the plating solution require periodic human work which is costly. Further, it is difficult with such operations to maintain the plating solution in an optimum condition. Still further, it is difficult to control the local temperature of the plating solution near the surface of a semiconductor substrate to be plated, since normally only the average temperature of the plating solution is monitored, often resulting in serious defects in the plated semiconductor substrate.

SUMMARY OF THE INVENTION

Therefore, it is an object of the invention to provide an apparatus for plating semiconductor substrates free of such plating defects as mentioned above.

In order to attain the object, there is provide in accordance with the invention an apparatus for metal plating, comprising:

- a multiplicity of substrate supporting members for supporting between electrodes a multiplicity of semiconductor substrates;
- a plating bath having therein said substrate supporting members;
- solution circulation means for circulating said plating solution past said semiconductor substrates;
- thermometers mounted on each of said substrate supporting members for measuring the temperatures of the plating solution near said semiconductor substrates;
- solution sampling means mounted on each of said substrate supporting members for sampling plating solution near said semiconductor substrates;
- heating means mounted in said plating bath for heating said plating solution;
- heating control means for controlling the operation of said heating means in response to the signal measured by said thermometers so as to regulate the temperature of said plating solution within a predetermined range;
- solution monitoring means for monitoring samples of the plating solution by testing the samples of said plating solution to determine the concentrations of the components of said plating solution;
- solution replenishment means for replenishing necessary amount of said components in said plating solution, on the basis of the measurements of said samples by said solution monitoring means.

With the apparatus having this structure, the plating solution may always have optimum conditions, so that such plating defects as mentioned above may be eliminated.

The above plating bath may be divided into a multiplicity of sub-baths each having substrate supporting members and solution circulation means for independent circulation of the solution in said sub-baths.

With such multiple sub-baths, the semiconductors in each of the sub-baths may be independently plated under different optimum conditions.

It is desirable to construct the plating solution circulation means such that the plating solutions are circulated by respective external pumps through respective external filters before they are returned to the respective sub-baths.

Such filters maintain the plating solutions clean, thereby improving a production yield of the plated semiconductor substrates.

The substrate supporting member is preferably equipped with a cylindrical member which may surround a semiconductor substrate, which is suspended therein by supporting pins at the upper end of the cylindrical member. A plating electrode of one polarity is located above, and in contact with, the upper surface of the substrate and a plating electrode of the opposite polarity is located beneath the substrate. The plating solution is ejected from the bottom of the cylindrical member upwardly towards the top opening of the cylinder, past the semiconductor substrate.

With this arrangement, it is possible to provide a flow of homogeneous plating solution over the entire lower surface of the substrate.

The heating means preferably includes, in addition to a heater for heating the entire plating solution in the plating bath, heaters one for each substrate supporting member for fine adjustment of local temperature near the surface of each substrate. Such heaters causes the plating solution near the surface of the semiconductor substrate to be maintained within a optimum temperature range for plating the substrate.

The solution monitoring means preferably includes: an atomic absorption spectrometer for detecting atomic spectrum indicative of the metal ion concentration in the plating solution; a specific gravimeter for measuring the specific gravitation of the solution; a pH gauge for measuring the pH level of said plating solution; and a particle density counter for counting the number of minute foreign particles floating in the solution.

The solution replenishing means replenishes necessary amount of plating solution, pH adjusting compounds, and pure water into the plating bath so that the metal ion concentration, pH level, and specific gravity of the plating solution may be maintained at an optimum level at all time, thereby ensuring desired plating.

It is preferable to provide the apparatus with an alarm means connected with said particle density counter for providing warning, on the basis of the output from said particle density counter, that the density of minute foreign particles in the plating solution exceeds a predetermined value.

Such alarm provides early warning of excessive contamination of the plating solution with foreign materials due to, for example, malfunction of filters or failure of other elements in the plating apparatus.

DETAILED DESCRIPTION OF THE PREFERRED EMBODIMENT

A first example of the invention is now described by way of example with reference to the accompanying drawings.

Figure 1:
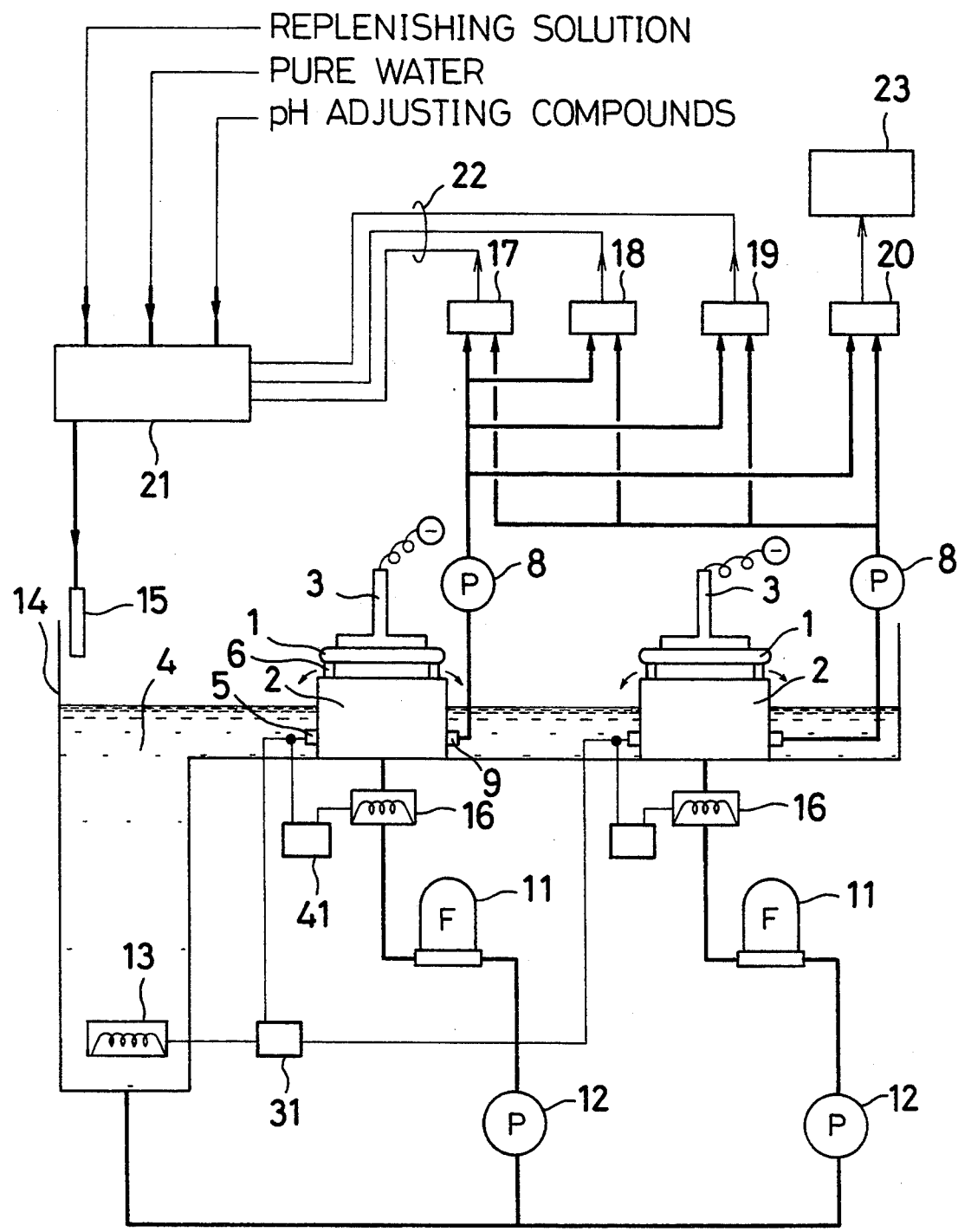
FIG. 1 is a schematic view of a first plating apparatus according to the invention.
Figure 2:
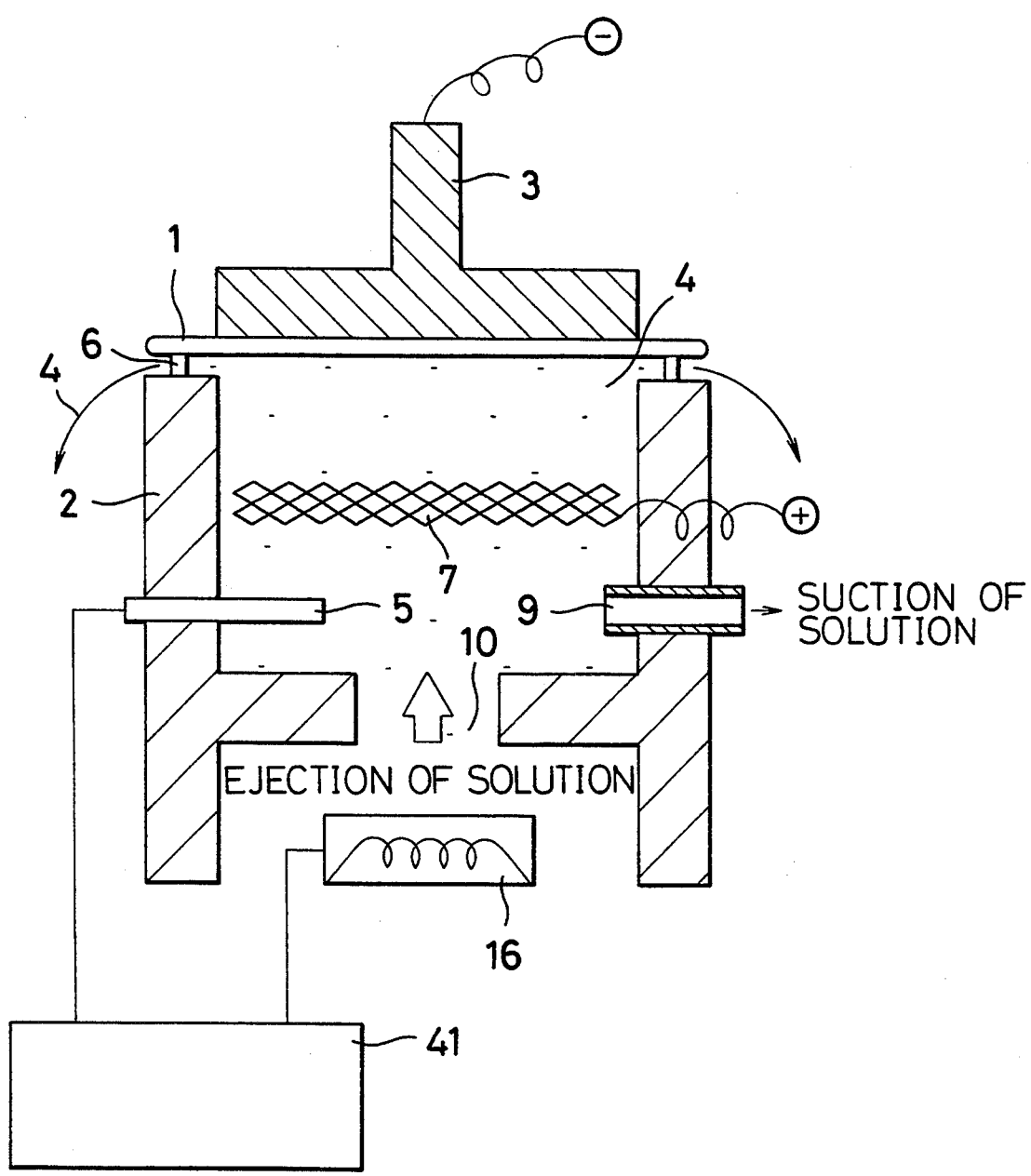
FIG. 2 illustrates, partly in cross section, a plating cup for use in the apparatus of the invention.

Referring to FIGS. 1 and 2, there is shown a plating apparatus which includes a plating bath 14 having therein a multiplicity of plating cups 2 or substrate supporting members. Each of the placing cups 2 has a cylindrical member which may surround a semiconductor substrate 1 supported at the upper end of the cylindrical member by supporting pins 6. A cathode electrode 3 is located above, and in contact with, the upper surface of the substrate 1 and an anode electrode 7 is located beneath the substrate 1. The plating solution 4 enters the cup from an inlet port 10, and is ejected from the bottom of the cylindrical member upwardly onto the semiconductor substrate 1. The solution finally overflows from the upper opening of the cylinder.

The plating apparatus has a solution circulation means for circulating the plating solution 4 between the plating bath 14 and external filters 11 by means of pumps 12. The solution circulation means also causes the plating solution 4 to be ejected onto the semiconductor substrate 1 while it is in circulation in the plating bath 14.

Thermometers 5 mounted on each of the plating cups 2 measure the temperatures of respective plating cups 2. Also provided in the plating apparatus are heating means for heating the plating solution 4 to a temperature within a predetermined range and a heating control means for controlling the operation of the heating means in response to the output from the thermometers 5. The heating means includes a heater 13 for heating the entire plating solution 4 in the plating bath 14 and a multiplicity of temperature adjustment heaters 16 mounted on respective plating cups 2 for fine adjustment of time respective temperatures of the plating cups 2. The heating control means includes a heater controller 31 for controlling the operation of the heater 13 and a fine temperature controller 41 for controlling the operations of the temperature adjustment heaters 16.

Each of the placing cups 2 is provided with a solution sampling means for sampling the plating solution near the semiconductor substrates 1. The solution sampling means includes a solution sampling port 9 and a solution sampling pump 8 for extracting the plating solution 4 from the solution sampling port 9.

The solution sampling pump 8 is connected with an atomic absorption spectrometer 17, a pH gauge 18, a specific gravimeter 19, and a foreign particle counter 20.

A solution replenishing means or a solution level regulator 21 replenishes plating solution, pH adjustment compounds, and pure water in response to signals from the atomic absorption spectrometer 17, the pH gauge 18, and the specific gravimeter 19 so that the concentrations of the components in the plating solution remain within a predetermined range.

An alarm means in the form of alarm indicator 23 generates alarm in response to a signal received from the foreign particle counter 20 when the particle density of foreign materials exceeds a predetermined level. The alarm means notifies an operator of necessary replacement of a filter 11 or of abnormal conditions of other elements in the apparatus.

The plating solution 4, cleaned by the external filters 11, is ejected from the bottom of the plating cups 2 upwardly onto the semiconductor substrates 1, as previously described.

The thermometers 5 mounted on respective plating cups 2 monitor the temperature of the plating solution 4 in the neighborhood of the semiconductor substrates 1 and send signals indicative of measured temperatures to the solution level regulator 21 and a temperature controller 41 included in the heating control means. The heating control means also includes a heater controller 31 for coarsely controlling the operation of the heater 13. The temperature controller 41 controls the temperature adjustment heaters 16 for fine adjustment of the temperature of the plating solution 4 in each plating cup 2 within a specified range of optimum plating temperature. A typical optimum temperature for non-cyan metal plating solution is 65° C., and an optimum range of plating temperature is 65° C.±5° C. Plating performed at a temperature outside this range can result in structural change in the plated metal layer and hardening and/or plating burn of the layer. Thus, in order to prevent such defects, it is necessary to maintain the plating solution at a proper temperature, which may be carried out by controlling the temperature adjustment heaters 16 by the temperature controller 41.

Samples of the plating solution 4 are extracted from the solution sampling port 9 and pumped by the respective solution sampling pump 8 to the atomic absorption spectrometer 17, the pH gauge 18, the specific gravimeter 19, and the foreign particle counter 20. The foreign particle counter 20 measures the density of foreign particles such as dust. The atomic absorption spectrometer 17 measures the concentration of the metal ions in the plating solution 4. The pH gauge 18 measures the pH level of the plating solution 4. The specific gravimeter 19 measures the specific gravity of the plating solution 4. These measurement data are sent to the solution level regulator 21 via data transmission lines 22.

The solution level regulator 21 includes memories for storing the reference data indicative of optimum ranges of the foreign particle density, the concentration of the metal ions and the pH level of the plating solution 4. The solution level regulator 21 also includes comparators for comparing these measurement data with corresponding reference data, and calculates the difference between the measured and reference values and controls the amounts of the plating solution, pH adjustment compounds, and pure water to be replenished from a replenishment port 15 of the plating bath 14 so as to recover optimum conditions of the plating solution. These amounts may be calculated on the basis of the total amount of the plating solution 4 in the plating bath 14, the reference and measured values, and the available concentrations of the replenishing plating solution and pH adjustment compounds.

As an example, in the case of metal plating mentioned above, standard reference value of the metal concentration in the plating solution 4 is 10 g/l. The concentration of the replenishing plating solution is 40 g/l. Assuming that the amount of the plating solution in the plating bath 14 is 30 l, and that the gold concentration as measured by the atomic absorption spectrometer 17 is about 9 g/l, then, in order to restore the standard concentration of 10 g/l for gold, 1 l of plating solution should be replenished. Thus, the solution level regulator 21 replenish 1 l of plating solution in the plating bath 14. Similarly, necessary amount of plating solution may be calculated to optimize the pH level and the specific gravity in the plating bath 14.

In the case of gold plating, optimum range of gold concentration is between 8 and 12 g/l. Below 8 g/l, the crystalline structure of the metal formed is thin and hard and likely to be glittering. Optimum pH level ranges from 7.5 to 8.5. pH levels outside this ranges results in thin and hard gold layers. Optimum range of the specific gravity ranges from Be 17.0 to Be 25.0. Above Be 25.0, salt deposition may occur in the plating solution, which salt can impose heavy lead on the circulation pump 12 and cause serious hazards in the apparatus.

By the use of the solution level regulator 21 to regulate the replenishing amounts of plating solution, pH adjustment compounds, and pure water, no only defective plating may be prevented to occur but also frequency of replacement of the entire plating solution and the amount of replacing works may be reduced.

Since the condition of the plating solution may be checked independently for each of the plating cups, it is easy to find a defective plating cup.

Figure 3:
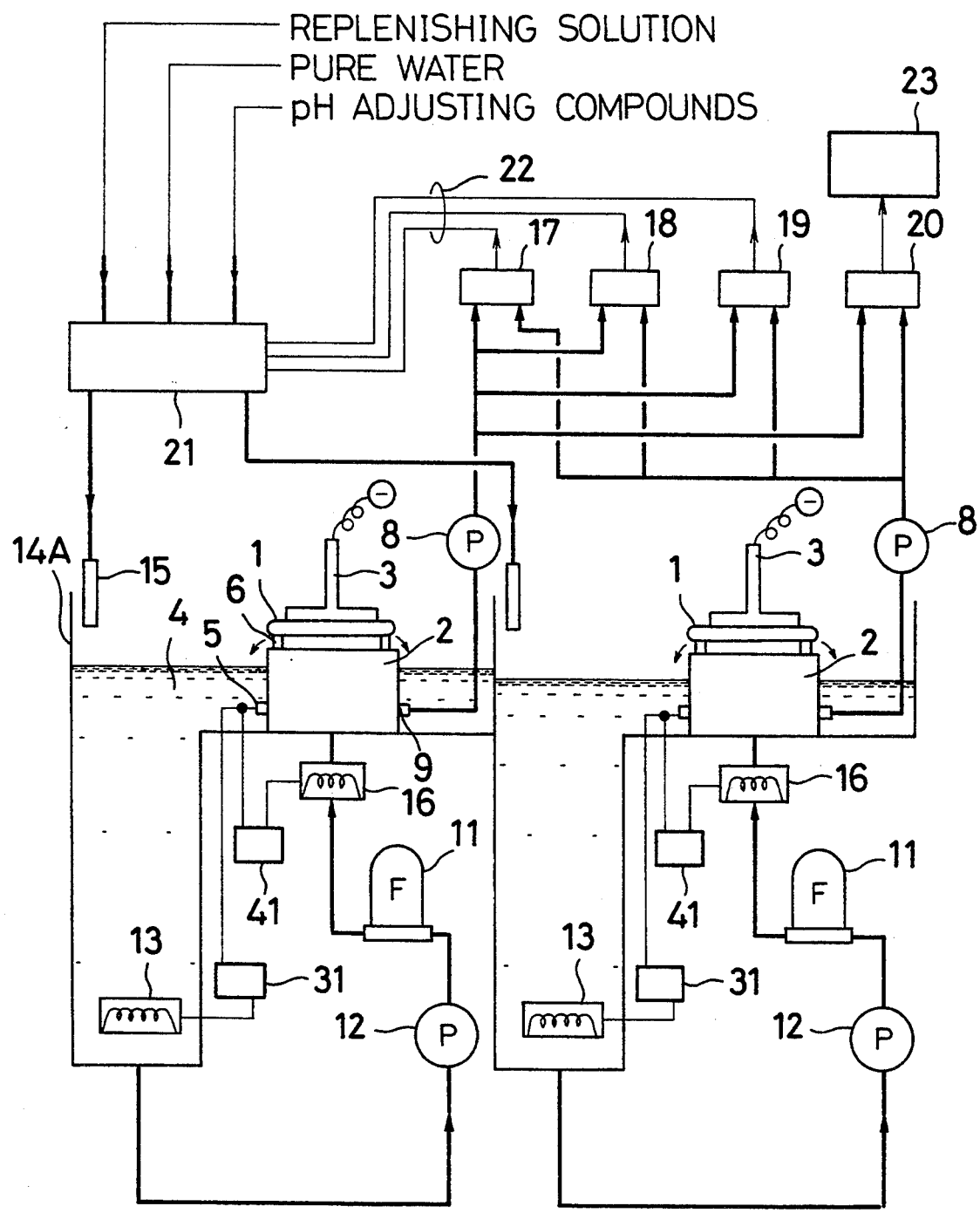
FIG. 3 is a schematic view of a second plating apparatus according to the invention.

A second example of the invention is now described below with reference to FIG. 3, in which similar or corresponding elements bear the same reference numbers as in FIGS. 1 and 2. The example shown in FIG. 3 differs from the one shown in FIGS. 1 and 2 in that the plating bath 14A is divided into a multiplicity of sub-baths having independent plating solution circulation systems. With this arrangement, in order to deposit the same metal under different conditions, it is possible to circulate various plating solutions having different concentrations of brighteners and metals.

For example, it is possible to simultaneously circulate plating solution having gold concentration of 10 g/l mentioned above in one cup, and plating solution having gold concentration of 1 g/l for plating the surface of copper plated humps in another cup. Thus, as in the first example above, optimum plating solutions and appropriate temperatures for the individual placing baths and plating cups through monitoring the plating solutions in the individual plating baths.

Since in the second example individual circulation systems are available, failure of one plating bath does not affect the rest of the plating baths, allowing continuation of plating operation while fixing the faulty one. Thus, a high production efficiency may be always maintained.

It should be noted that such multiple plating baths mentioned above permit of efficient plating of varied kinds of materials in small lot, in a relatively compact plating apparatus.

I claim:

1. An apparatus for metal plating, comprising:
   a multiplicity of substrate supporting members for supporting between electrodes a multiplicity of semiconductor substrates;
   said substrate supporting members comprising at least one cylindrical member;
   supporting pins for supporting said semiconductor substrates at an upper end of said at least one cylindrical member;
   a multiplicity of cathode electrodes, there being one cathode electrode for each semiconductor substrate, above and in contact with an upper surface of said semiconductor substrates and a multiplicity of anode electrodes beneath each of said semiconductor substrate,
   a plating bath having therein said substrate supporting members;
   solution circulation means for circulating said plating solution past said semiconductor substrates;
   said solution circulation means including means for ejecting said plating solution from a bottom of said cylindrical member onto a lower surface of each semiconductor substrate and for enabling said plating solution to overflow from the upper end of said cylindrical member,
   thermometers mounted on each of said substrate supporting members for measuring the temperatures of the plating solution near said semiconductor substrates;
   solution sampling means mounted on each of said substrate supporting members for sampling plating solution near said semiconductor substrates;
   heating means mounted in said plating bath for heating said plating solution;
   heating control means for controlling the operation of said heating means in response to the signal measured by said thermometers so as to regulate the temperature of said plating solution within a predetermined range;
   solution monitoring means for monitoring said plating solution by testing the samples of said plating solution to determine the concentrations of the components of said plating solution; and
   solution replenishment means for replenishing a necessary amount of said components in said plating solution, on a basis of the measurements of said samples by said solution monitoring means.

2. The plating apparatus according to claim 1, wherein said plating bath is divided into a multiplicity of sub-baths having substrate supporting members and solution circulation means for independent circulation of the plating solution in said sub-baths.

3. The plating apparatus according to claim 1, wherein said solution circulation means comprises pipes for circulating said plating solution, filters mounted in said pipes outside said plating bath for filtering said plating solution, and pumps for circulating said plating solution through said filters before returning said plating solution back to said plating bath.

4. The plating apparatus according to claim 1, wherein said heating means comprises;
   a heater for heating the entire plating solution in said plating bath; and
   a multiplicity of temperature adjustment heaters each mounted on respective one of said substrate supporting members.

5. The plating apparatus according to claim 1, wherein said solution monitoring means comprises;
   an atomic absorption spectrometer for detecting atomic spectrum indicative of the metal ion concentrations in the plating solution;
   a specific gravimeter for measuring the specific gravitation of said plating solution;

a pH gauge for measuring the pH level of said placing solution;

a particle density counter for counting the number of minute foreign particles floating in said plating solution.

6. The plating apparatus according to claim 5, wherein said solution replenishing means replenishes necessary amount of plating solution, pH adjusting compounds, and pure water into the plating bath so that the metal ion concentration, pH level, and specific gravity of the plating solution may be maintained at an optimum level at all time.

7. The plating apparatus according to claim 5, further comprising:

a particle density counter for counting foreign particles in said plating solution; and an alarm means connected with said particle density counter for providing warning, on the basis of the output from said particle density counter, that the density of minute foreign particles in the plating solution exceeds a predetermined value.

8. A plating apparatus, comprising:

a plating bath having at least one cathode electrode and at least one anode electrode; at least one cylindrical plating cup in said plating bath for accommodating a plating solution;

a multiplicity of support pins on top of said plating cup for supporting a plating substrate;

a pump for pumping said plating solution in said plating cup onto said plating substrate;

a temperature sensor in said plating cup for monitoring a temperature of said plating solution in said cup;

solution sampling means in said plating cup for sampling said plating solution in said plating cup;

temperature controller means responsive to the temperature sensed by said temperature sensor for controlling the temperature of said plating solution pumped onto said substrate; and solution replenishment means responsive to data obtained by said solution sampling means for replenishing said plating solution in said plating bath.

9. A plating apparatus as claimed in claim 8, further comprising:

means for returning said plating solution from said plating bath to said pump, and wherein;

said temperature controller means includes a first controller for controlling the temperature of said plating solution in said plating bath and a second temperature controller for controlling the temperature of said solution in said plating cup.

* * * * *